(12) United States Patent
Wendler et al.

(10) Patent No.: US 12,352,792 B2
(45) Date of Patent: Jul. 8, 2025

(54) DETECTOR CIRCUIT, SIGNAL PROCESSING CIRCUIT, AND MEASUREMENT INSTRUMENT

(71) Applicant: Rohde & Schwarz GmbH & Co. KG, Munich (DE)

(72) Inventors: Wolfgang Wendler, Munich (DE); Gregor Feldhaus, Munich (DE); Florian Ramian, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 246 days.

(21) Appl. No.: 18/169,732

(22) Filed: Feb. 15, 2023

(65) Prior Publication Data
US 2024/0019470 A1   Jan. 18, 2024

(30) Foreign Application Priority Data
Jul. 18, 2022   (EP) ..................................... 22185485

(51) Int. Cl.
*G01R 23/16* (2006.01)
(52) U.S. Cl.
CPC .................................... *G01R 23/16* (2013.01)
(58) Field of Classification Search
CPC ................ G01R 33/00; G01R 31/2834; G01R 31/2867; G01R 31/2874; G01R 31/2893; G01R 31/31905; G01R 31/31725; G01R 23/16
See application file for complete search history.

(56) References Cited

U.S. PATENT DOCUMENTS

| 10,756,829 B1 | 8/2020 | Therrien |
| 2004/0161028 A1 | 8/2004 | Roberts et al. |
| 2005/0238094 A1 | 10/2005 | Bessho et al. |

(Continued)

OTHER PUBLICATIONS

Lepek, A. and F.L. Walls, "Cross Correlation Analysis Improves Time Domain Measurements," 1993 IEEE International Frequency Control Symposium, downloaded Feb. 21, 2022, pp. 312-320.

(Continued)

*Primary Examiner* — Lee E Rodak
*Assistant Examiner* — Taqi R Nasir
(74) *Attorney, Agent, or Firm* — CHRISTENSEN O'CONNOR JOHNSON KINDNESS PLLC

(57) ABSTRACT

A detector circuit for a measurement instrument is described. The detector circuit includes a first signal input, a second signal input, and an averaging sub-circuit. The first signal input is configured to receive a first complex-valued measurement signal associated with an input signal received from a device under test. The second signal input is configured to receive a second complex-valued measurement signal associated with the input signal received from the device under test. The averaging sub-circuit is configured to determine an average of the first complex-valued measurement signal and of a complex conjugate of the second complex-valued measurement signal over a predetermined number of samples, thereby obtaining a complex-valued average signal. The averaging sub-circuit is configured to generate an output signal based on the complex-valued average signal. Further, a signal processing circuit and a measurement instrument are described.

17 Claims, 3 Drawing Sheets

(56) References Cited

U.S. PATENT DOCUMENTS

| | | | |
|---|---|---|---|
| 2007/0225927 A1* | 9/2007 | Bessho | G01R 29/26 |
| | | | 702/72 |
| 2010/0048143 A1 | 2/2010 | Wendlet et al. | |
| 2015/0108971 A1* | 4/2015 | Granig | G01R 33/09 |
| | | | 324/252 |
| 2022/0065972 A1* | 3/2022 | Chaudhary | G01R 35/005 |

OTHER PUBLICATIONS

Oude Alink, M.S. et al., "Spectrum Sensing With High Sensitivity and Interferer Robustness Using Cross-Correlation Energy Detection," IEEE Journal on Emerging and Selected Topics in Circuits and Systems, vol. 3, No. 4, Dec. 2013, pp. 566-575.

Wan, K.W. et al., "A Novel Approach to the Simultaneous Measurement of Phase and Amplitude Noises in Oscillator," Proceedings of the European Microwave Conference, London, Sep. 1989, pp. 809-813.

* cited by examiner

| Detector | Operation |
|---|---|
| Sample Detector | $y_{det} = x(0)$ |
| Minimum Detector | $y_{det} = \min\limits_{k=0 \text{ to } N-1} x(k)$ |
| Maximum Detector | $y_{det} = \max\limits_{k=0 \text{ to } N-1} x(k)$ |
| Average Detector | $y_{det} = \frac{1}{N} \cdot \sum_{k=0}^{N-1} x(k)$ |
| RMS Detector | $y_{det} = \sqrt{\frac{1}{N} \cdot \sum_{k=0}^{N-1} |x(k)|^2}$ |
| x-corr Detector | $y_{det} = \sqrt{\frac{1}{N} \cdot \left| \sum_{k=0}^{N-1} x_1(k) \cdot x_2^*(k) \right|}$ |

DETECTOR CIRCUIT, SIGNAL PROCESSING CIRCUIT, AND MEASUREMENT INSTRUMENT

FIELD OF THE DISCLOSURE

Embodiments of the present disclosure generally relate to a detector circuit for a measurement instrument. Embodiments of the present disclosure further relate to a signal processing circuit for a measurement instrument, and to a measurement instrument.

BACKGROUND

Measurement detectors are used in order to map a higher number of measurement points to a lower number of output results. For example, root-mean-square (RMS) detectors are used in order to determine the average power of a signal, e.g., for noise analysis.

However, detectors such as RMS detectors cannot distinguish between noise that originates from the device under test (DUT) and noise added by the measurement instrument itself.

Accordingly, if the measurement instrument has an intrinsic noise level that is of the same magnitude or even higher than the noise level of the device under test, the noise caused by the device under test cannot be reliably measured. In addition, a small signal of a device under test below the intrinsic noise level of the measurement instrument cannot be detected.

A known solution to this problem is to conduct a reference measurement without the device under test in the signal chain. The additional noise generated by the measurement instrument can be determined based on the reference measurement, and can be subtracted in the corresponding measurement of the device under test. However, this only works reliably to a certain extent of up to around 10 dB.

However, performing the additional reference measurement takes additional time. Moreover, the measurement instrument may behave differently when the device under test is connected to the measurement instrument and when the device under test is not connected to the measurement instrument.

Thus, there is a need for a measurement instrument, for a signal processing circuit for a measurement instrument, as well as for a measurement instrument that allow for a faster analysis of the noise level of a device under test.

SUMMARY

Embodiments of the present disclosure provide a detector circuit for a measurement instrument. In an embodiment, the detector circuit comprises a first signal input, a second signal input, and an averaging sub-circuit. The first signal input is configured to receive a first complex-valued measurement signal associated with an input signal received from a device under test. The second signal input is configured to receive a second complex-valued measurement signal associated with the input signal received from the device under test. The averaging sub-circuit is configured to determine a combined average of the first complex-valued measurement signal and of a complex conjugate of the second complex-valued measurement signal over a predetermined number of samples, thereby obtaining a complex-valued average signal. The averaging sub-circuit is configured to generate an output signal based on the complex-valued average signal.

Examples of the detector circuit according to the present disclosure are based on the idea to selectively remove noise originating from sources other than the device under test from the input signal by averaging the cross-correlation between the first complex-valued measurement signal and the second complex-valued measurement signal over the predetermined number of samples.

Therein, both the amplitudes and the phases of the complex-valued measurement signals are taken into account for determining the combined average. In other words, the complex-valued measurement signals each comprise amplitude information and phase information that is considered for determining the combined average. Accordingly, the combined average may also be called a "vector average".

The first complex-valued measurement signal and the second complex-valued measurement signal both are associated with the same input signal received from the device under test.

Accordingly, by performing the combined averaging described above, the resulting complex-valued average signal comprises significantly reduced noise from sources other than the device under test.

This is due to the fact that both the first complex-valued measurement signal and the second complex-valued measurement signal comprise noise originating from the device under test, such that these portions of the complex-valued measurement signals are correlated with each other and do not cancel out when performing the combined average.

On the other hand, noise originating from other sources, e.g., from measurement channels processing the input signal in parallel, is not correlated with each other and at least partially cancels out when performing the combined average.

Thus, the detector circuit according to embodiments of the present disclosure effectively reduces the noise level, but without impairing the ability to analyze the noise contribution of the device under test.

In some embodiments, the detector circuit according to the present disclosure allows for a fast suppression of the intrinsic noise of the measurement instrument such that e.g., the noise level of the device under test and/or small-amplitude signals of the device under test can reliably be measured.

Further, the detector circuit according to embodiments of the present disclosure allows for increasing the signal-to-noise ratio for measurements of signals of the device under test, for example for measurements of small-amplitude signals of the device under test.

Moreover, an additional reference measurement for determining the noise contribution of components in the signal chain other than the device under test is not necessary. Thus, the noise contribution of the device under test can reliably be analyzed based on a single measurement.

In some embodiments, the averaging sub-circuit may comprise a multiplication unit composed of circuitry configured to multiply the first complex-valued measurement signal with the complex conjugate of the second complex-valued measurement signal, thereby obtaining a complex-valued multiplication signal.

In some embodiments, the averaging sub-circuit may further be configured to average the complex-valued multiplication signal over the predetermined number of samples, thereby obtaining the complex-valued average signal.

If the first complex-valued measurement signal and the second complex-valued measurement signal are in the frequency domain, the complex-valued average signal corresponds to a cross-correlation between the first complex-valued measurement signal and the second complex-valued measurement signal averaged over the predetermined number of samples. This is due to the fact that a multiplication of the complex-valued measurement signals in frequency domain corresponds to a convolution of the complex-valued measurement signals in time domain.

In other words, the complex-valued average signal may correspond to the trace of the cross-correlation matrix of the first complex-valued measurement signal and the second complex-valued measurement signal, divided by the predetermined number of samples.

Accordingly, the detector circuit according to embodiments of the present disclosure may, colloquially, be called a "cross correlation detector" or an "x-corr detector".

In some embodiments, the predetermined number of samples may be coupled to a sweep time parameter of, for example, a spectrum analyzer. Thus a larger sweep time parameter may be associated with a larger predetermined number of samples.

According to an aspect of the present disclosure, the averaging sub-circuit is configured, for example, to determine an absolute value of the complex-valued average signal in order to generate the output signal. Alternatively or additionally, the averaging sub-circuit is configured, for example, to determine a real part of the complex-valued average signal in order to generate the output signal. The absolute value of the complex-average signal is a measure for the power of the wanted signal (also called "useful signal") of the device under test (including the noise contribution of the device under test), as other noise contributions cancel partially or completely due to the combined average performed. It has been recognized by the inventors of the present application that the real part of the complex-valued average signal is also an appropriate measure for the power of the wanted signal of the device under test (including the noise contribution of the device under test), for example if the predetermined number of samples is large. However, using the real part may not be appropriate in some circumstances, e.g. if the real part is negative.

In some embodiments, the unwanted noise contributions are reduced, for example, approximately by $5 \cdot \log\_10 (N)$ dB or by $1V\sqrt{N}$, respectively, wherein N is the predetermined number of samples.

In some embodiments, the averaging sub-circuit may be switchable between an absolute value mode, wherein the averaging sub-circuit is configured to determine the absolute value of the complex-valued average signal, and a real part mode, wherein the averaging sub-circuit is configured to determine the real part of the complex-valued average signal. In other words, a user, for example, may select which mode is used by the averaging sub-circuit.

According to another aspect of the present disclosure, the first complex-valued measurement signal and the second complex-valued measurement signal are established, for example, as an IQ signal, respectively. Alternatively or additionally, the first complex-valued measurement signal and the second complex-valued measurement signal are established, for example, as a Fourier transformed signal, respectively.

If the complex-valued measurement signals are established as an IQ signal, respectively, the averaging sub-circuit in some embodiments is configured to perform the combined average on the IQ signals as described above. Accordingly, the averaging sub-circuit averages over several consecutive samples of the IQ signals, as described above.

If the complex-valued measurement signals are established as a Fourier transformed signal, respectively, the averaging sub-circuit in some embodiments averages over several consecutive samples of the Fourier transformed signals in time domain and/or in frequency domain. In other words, the averaging sub-circuit may perform the combined average over subsequent samples of the Fourier transformed signals, and/or over adjacent bins of the Fourier transformed signals.

In an embodiment of the present disclosure, the predetermined number of samples is adjustable. In general, increasing the predetermined number of samples leads to an enhanced noise suppression, as the non-correlated portions of the noise, i.e. the unwanted noise portions, are suppressed more the larger the number of the predetermined samples is. As the predetermined number of samples is adjustable, the detector circuit can be adapted for different requirements, ranging from high resolution to high noise suppression.

In a further embodiment of the present disclosure, the detector circuit is switchable between different detector modes. In an embodiment, the detector modes comprise a cross correlation detector mode and one or several of the following detector modes: a sample detector mode, a minimum detector mode, a maximum detector mode, an auto peak detector mode, an average detector mode, and a root mean square detector mode. In other words, the detector circuit is configured to provide one or several output signals (also called "traces"), wherein different mathematical operations are applied to the measurement signals in the different detector modes.

In some embodiments, for the sample detector mode, the minimum detector mode, the maximum detector mode, the auto peak detector mode, the average detector mode, and the root mean square detector mode, at least one of the complex-valued measurement signals may be converted into a real-valued measurement signal before processing by the detector circuit.

For example, at least one conversion unit may be arranged upstream of the first signal input and/or upstream of the second signal input. The at least one conversion unit may include circuitry configured to convert the first complex-valued measurement signal and/or the second complex-valued measurement signal into a real-valued measurement signal. Alternatively, the detector circuit may comprise the conversion unit.

In some embodiments, in the sample detector mode, the minimum detector mode, the maximum detector mode, the auto peak detector mode, the average detector mode, and the root mean square detector mode, only one of the complex-valued measurement signals may be converted into a real-valued measurement signal and processed by the detector circuit.

In some embodiments, more than one detector mode may be active at a time, such that the detector circuit provides at least two output signals corresponding to at least two different detector modes.

The output signal(s) generated by the detector circuit may be displayed on a display. In some embodiments, the at least two output signals may be displayed on the display simultaneously.

In some embodiments, a user may select the one or several of the detector modes that are to be applied to the complex-valued measurement signals, e.g., by a suitable user interface of a measurement instrument comprising the detector circuit. In some embodiments, different modes of the detector circuit may correspond to different detectors that may be selected by the user.

Embodiments of the present disclosure further provide a signal processing circuit for a measurement instrument. In an embodiment, the signal processing circuit comprises a detector circuit described above and a measurement input. The signal processing circuit comprises two parallel measurement channels each connected to the measurement input, such that an input signal received via the measurement input is forwarded to the two parallel measurement channels. A first one of the two parallel measurement channels is connected with the first signal input and a second one of the two parallel measurement channels is connected with the second signal input. The first one of the two parallel measurement channels is configured to process the input signal, thereby generating the first complex-valued measurement signal. The second one of the two parallel measurement channels is configured to process the input signal, thereby generating the second complex-valued measurement signal.

Therein, the first signal input of the detector circuit is arranged downstream of the first one of the two parallel measurement channels, and the second signal input of the detector circuit is arranged downstream of the second one of the two parallel measurement channels.

In some embodiments, the signal processing circuit comprises exactly two parallel measurement channels connected to the measurement input.

Regarding the further advantages and properties of the signal processing circuit, reference is made to the explanations given above with respect to the detector circuit, which also hold for the signal processing circuit and vice versa.

According to an aspect of the present disclosure, the two parallel measurement channels are, for example, functionally identical. In other words, the two parallel measurement channels are identically constructed, i.e., they comprise identically constructed electronic components. Thus, the two parallel measurement channels process the input signal received from the device under test in the same way. However, noise originating in the first one of the two parallel measurement channels is not correlated with noise originating in the second one of the two parallel measurement channels, and thus cancels when performing the combined average of the complex-valued measurement signals.

According to another aspect of the present disclosure, the two parallel measurement channels each comprise, for example, an analog-to-digital converter. The analog-to-digital converters may be functionally identical, i.e., identically constructed. Thus, additional noise generated by the analog-to-digital converters is not correlated with each other, and thus cancels when performing the combined average of the complex-valued measurement signals.

In an embodiment of the present disclosure, the two parallel measurement channels are synchronized. In other words, the same portions of the input signal are processed by the two parallel measurement channels simultaneously, such that samples corresponding to the same portions of the input signal are forwarded to the first input and to the second input at the same time. This ensures that the wanted signal (also called "useful signal") including the noise generated by the device under test does not cancel when performing the combined average.

In a further embodiment of the present disclosure, the two parallel measurement channels each comprise a mixer sub-circuit configured to convert the input signal into an IQ signal, respectively. Thus, the complex-valued measurement signals forwarded to the detector circuit may be established as an IQ signal, respectively. Accordingly, the averaging sub-circuit averages over several consecutive samples of the IQ signals, as described above.

In some embodiments, the two parallel measurement channels each comprise a resolution bandwidth (RBW) filter. In some embodiments, the RBW filters are functionally identical, i.e., identically constructed. The RBW filters determine the resolution bandwidth of the signal processing circuit, and thus the resolution bandwidth of a measurement instrument comprising the signal processing circuit.

The resolution bandwidth may be fixed or may be adjustable, for example adjustable by a user via a suitable user interface.

According to another aspect of the present disclosure, the two parallel measurement channels each comprise, for example, a Fourier transform unit. In some embodiments, the Fourier transform units include circuitry configured to determine a Fourier transform of the respective signal processed in the respective measurement channel over a predetermined time interval, for example wherein the predetermined time interval is adjustable. In other words, the Fourier transform units determine a series of Fourier transforms of the respective signal processed over the predetermined time interval. Therein, the time intervals associated with consecutive Fourier transforms may overlap. As a result, the Fourier transformed signals comprise both time and frequency information.

Accordingly, the averaging sub-circuit of the detector circuit may average over several consecutive samples of the Fourier transformed signals in time domain and/or in frequency domain. In other words, the averaging sub-circuit may perform the combined average over subsequent samples of the Fourier transformed signals, and/or over adjacent bins of the Fourier transformed signals.

In some embodiments, the Fourier transform units include circuitry configured to determine a fast Fourier transform (FFT) of the respective signal processed. The Fourier transforms of the respective signals may be determined online, i.e., in real-time or live. In some embodiments, the Fourier transforms may be determined and be processed subsequently by the detector circuit in real-time, such that a real-time analysis of the input signal received from the device under test is provided.

Alternatively or additionally, the Fourier transforms of the respective signals may be determined offline, i.e., based on samples of the input signal of the device under test stored in a measurement memory. In some embodiments, the Fourier transforms may be determined and subsequently be processed by the detector circuit offline.

In some embodiments, the first signal input and the second signal input may be selectively connectable to a measurement memory, and/or to the parallel measurement channels. In other words, the signal processing circuit and the detector circuit may process an input signal received from the device under test in real time. However, the detector circuit may also process an input signal associated with the device under test that has been previously processed by the parallel measurement channels and recorded in the measurement memory.

Embodiments of the present disclosure further provide a measurement instrument. In an embodiment, the measurement instrument comprises a detector circuit described above and/or a signal processing circuit described above.

Embodiments of the present disclosure further provide a measurement instrument. In an embodiment, the measurement instrument comprises a signal processing circuit described above. The measurement instrument may be established, for example, as a signal analyzer, as a spectrum analyzer, as an electromagnetic interference (EMI) test receiver, as an EMI measuring receiver, as an oscilloscope, as a digital oscilloscope, or as a power sensor. However, it is to be understood that the measurement instrument may be established as any other suitable measurement instrument.

Regarding the further advantages and properties of the measurement instrument, reference is made to the explanations given above with respect to the detector circuit and to the signal processing circuit, which also hold for measurement instrument and vice versa.

According to an aspect of the present disclosure, the measurement instrument comprises, for example, a display configured to display the output signal of the detector circuit. The display may be configured to display several output signals of the detector circuit simultaneously, for example several output signals corresponding to several detector modes of the detector circuit described above.

In some embodiments, the measurement instrument may further comprise a user interface. The user interface may comprise one or more inputs, such as switches, buttons, knobs, touchscreen interfaces, or other means that allow a user to set operational parameters of the measurement instrument, for example the detector mode, the predetermined number of samples, the resolution bandwidth, etc.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
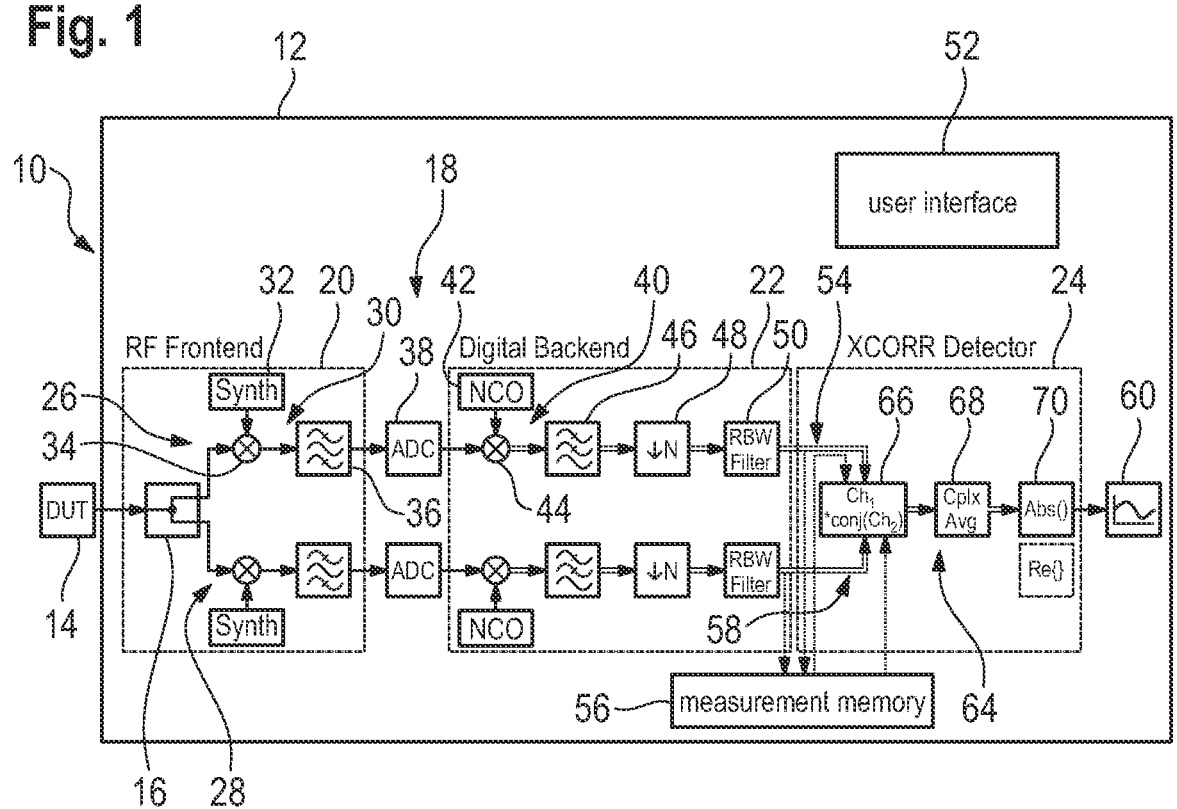
FIG. 1 schematically shows a measurement instrument according to an embodiment of the present disclosure.

FIG. 1 schematically shows an example of a measurement system 10 comprising a representative measurement instrument 12 and a device under test 14. In general, the measurement instrument 12 is configured to analyze an input signal received from the device under test 14 in order to analyze certain properties of the device under test 14. For example, the measurement instrument 12 may be a signal analyzer, a spectrum analyzer, an electromagnetic interference (EMI) test receiver, an EMI measuring receiver, an oscilloscope, a digital oscilloscope, or a power sensor. However, the measurement instrument 12 may be established as any other type of measurement instrument, depending on which aspects of the performance of the device under test 14 are to be tested.

The device under test 14 may be established as any electronic device that is configured to generate a radio-frequency (RF) signal. For example, the device under test 14 comprises one or several electronic circuits generating an RF signal, wherein the performance of the electronic circuit(s) is assessed by the measurement instrument 12.

The device under test 14 is connected with the measurement instrument 12 in a signal-transmitting manner Therein and in the following, the term "connected in a signal transmitting manner" is understood to denote a cable-based or wireless connection that is configured to transmit signals between the respective devices or components.

For example, the device under test 14 is connected to a measurement input 16 of the measurement instrument 12 via a suitable cable and suitable connectors, such that an electric signal output by the device under test 14 is transmitted from the device under test 14 to the measurement instrument via the cable. Alternatively, the device under test 14 may transmit a wireless electromagnetic signal, which is received via an RF antenna connected to the measurement input 16. Alternatively, a measurement probe may be connected to the measurement input 16, wherein the measurement probe is configured to pick up an electric signal from the device under test 14 by contacting corresponding contact points of the device under test 14.

In the embodiment shown, the measurement instrument 12 comprises a signal processing circuit 18 having an RF frontend 20, a digital backend 22, and a detector circuit 24.

In embodiments herein, the terms "circuit" and "unit" are understood to describe suitable hardware, suitable software, or a combination of hardware and software that is configured to carry out certain functionality described herein. In some embodiments, the term "unit" may denote a circuit having a certain functionality. The hardware may, inter alia, comprise a CPU, a GPU, an FPGA, an ASIC, or other types of electronic circuitry.

Still referring to the embodiment of FIG. 1, the measurement instrument 12 comprises a first measurement channel 26 and a second measurement channel 28 that are each connected to the measurement input 16. The measurement channels 26, 28 are arranged in parallel, such that an input signal received from the device under test 14 via the measurement input 16 is forwarded to and processed by both measurement channels 26, 28 in parallel.

The measurement channels 26, 28 are functionally identical, i.e., the electronic components of the first measurement channel 26 are identical in construction to the electronic components of the second measurement channel 28. Thus, only the first measurement channel 26 is described in the following, as the explanations given hereinafter likewise apply to the second measurement channel 28.

In the embodiment shown in FIG. 1, the first measurement channel 26 comprises a first mixer sub-circuit 30 that is associated with the RF frontend 20 of the measurement instrument 12. In general, the first mixer sub-circuit 30 is configured to down-convert the input signal received from the device under test 14 to an intermediate frequency being suitable for processing by the electronic components downstream of the first mixer sub-circuit 30. As usual, the first mixer sub-circuit 30 comprises a local oscillator input 32 that is configured to receive a local oscillator signal.

The first mixer sub-circuit 30 may further comprise, for example, a mixer unit 34 that includes circuitry configured to mix the input signal received from the device under test 14 with the local oscillator signal, and a band-pass filter 36 that is configured to appropriately filter the resulting mixed signal in order to down-convert the input signal to the intermediate frequency.

Therein, the frequency of the local oscillator signal may be constant. Alternatively, the frequency of the local oscillator signal may be time-variant, i.e., a frequency sweep may be applied to the local oscillator signal.

As shown in the embodiment of FIG. 1, the first measurement channel 26 further comprises an analog-to-digital converter (ADC) 38 that is configured to digitize the signal output by the first mixer sub-circuit 30, and a second mixer sub-circuit 40 having an oscillator input 42, a mixer 44, and a filter 46.

In general, the second mixer sub-circuit 40 is configured to mix the digitized signal received from the ADC 38 into the complex baseband by any suitable technique known in the art. In some embodiments, the second mixer sub-circuit 40 may be configured to generate an IQ signal based on the digitized signal received from the ADC 38 by any suitable technique known in the art.

The frequency of the local oscillator signal received via the oscillator input 42 may be constant. Alternatively, the frequency of the local oscillator signal received via the oscillator input 42 may be time-variant, i.e., a frequency sweep may be applied to the local oscillator signal.

In the embodiment shown in FIG. 1, the first measurement channel 26 further comprises a down-converter unit 48 and a resolution bandwidth (RBW) filter 50. The down-converter unit 48 includes circuitry configured to down-sample the signal received from the second mixer sub-circuit 40 by a predetermined factor, i.e., to reduce the number of samples by a predetermined factor.

The RBW filter 50 determines the resolution bandwidth of the first measurement channel 26. The resolution bandwidth may be fixed or may be adjustable. In some embodiments, the resolution bandwidth may be adjustable by a user via a user interface 52 of the measurement instrument 12.

Summarizing, an input signal received from the device under test 14 is processed by the electronic components of the first measurement channel 26 described above, thereby generating a first complex-valued measurement signal. Likewise, the input signal received from the device under test 14 is processed by the electronic components of the second measurement channel 28, thereby generating a second complex-valued measurement signal.

In some embodiments, the two parallel measurement channels 26, 28 are synchronized. In other words, the same portions of the input signal are processed by the two parallel measurement channels 26, 28 simultaneously.

The first complex-valued measurement signal is forwarded to a first signal input 54 of the detector circuit 24. Alternatively or additionally, the first complex-valued measurement signal is saved in a measurement memory 56 of the measurement instrument 12.

The second complex-valued measurement signal is forwarded to a second signal input 58 of the detector circuit 24. Alternatively or additionally, the second complex-valued measurement signal is saved in the measurement memory 56.

In general, the detector circuit 24 is configured to apply mathematical operations to the complex-valued measurement signals in order to transform the complex-valued measurement signals into an output signal, i.e., into a measurement trace to be displayed on a display 60 of the measurement instrument 12.

In some embodiments, the input signal may be received from the device under test 14 and processed by the signal processing circuit 18, for example by the detector circuit 24 in real time. Alternatively, the input signal may be received from the device under test 14, processed by the measurement channels 26, 28 as described above, and the complex-valued measurement signals may be saved in the measurement memory 56. The saved complex-valued measurement signals may later be forwarded to the signal inputs 54, 58 for further processing by the detector circuit 24.

In accordance to some embodiments of the present disclosure, the type of the mathematical operations applied to the measurement signals depends on a detector mode of the detector circuit 24. In that regard, the detector circuit 24 may be switchable between different detector modes. In some embodiments, the detector modes comprise a cross correlation detector mode and one or several of the following detector modes: a sample detector mode, a minimum detector mode, a maximum detector mode, an auto peak detector mode, an average detector mode, and a root mean square detector mode.

In some embodiments, for the sample detector mode, the minimum detector mode, the maximum detector mode, the auto peak detector mode, the average detector mode, and the root mean square detector mode, at least one of the complex-valued measurement signals may be converted into a real-valued measurement signal before processing by the detector circuit 24.

For example, at least one conversion unit may be arranged upstream of the first signal input and/or upstream of the second signal input. In some embodiments, the at least one conversion unit includes circuitry configured to convert the first complex-valued measurement signal and/or the second complex-valued measurement signal into a real-valued measurement signal. Alternatively, the detector circuit 24 may comprise the conversion unit.

In some embodiments, in the sample detector mode, the minimum detector mode, the maximum detector mode, the auto peak detector mode, the average detector mode, and the root mean square detector mode, only one of the complex-valued measurement signals may be converted into a real-valued measurement signal and processed by the detector circuit 24.

Figure 2:
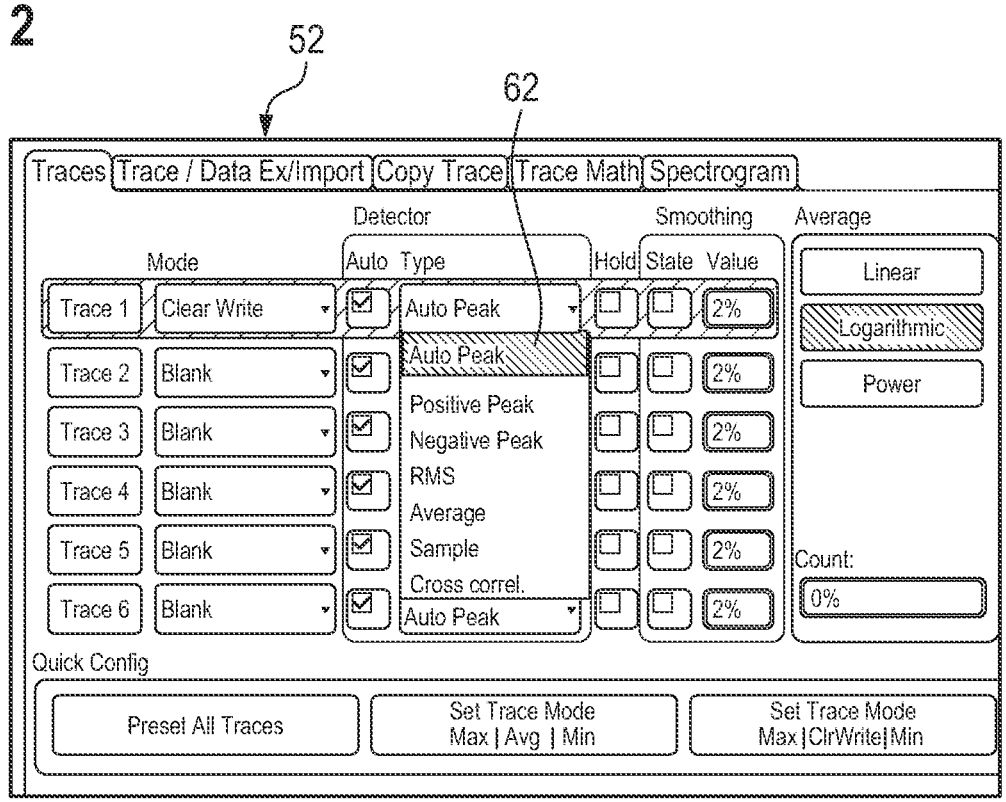
FIG. 2 schematically shows an example of a user interface of the measurement instrument of FIG. 1.

In some embodiments, a user may select one or several detector modes to be applied to the complex-valued measurement signals via the user interface 52. FIG. 2 shows an representative embodiment of the user interface 52. As is illustrated in FIG. 2, the user may select the one or several detector modes ("Trace 1" to "Trace 6" in FIG. 2)) from a drop-down menu 62. Further, the user may adjust other operational parameters of the detector circuit 24, of the signal processing circuit 18, and/or of the measurement instrument 12 by the user interface 52. However, it is to be understood that any other type of user interface may be used.

Figures 3, 4:
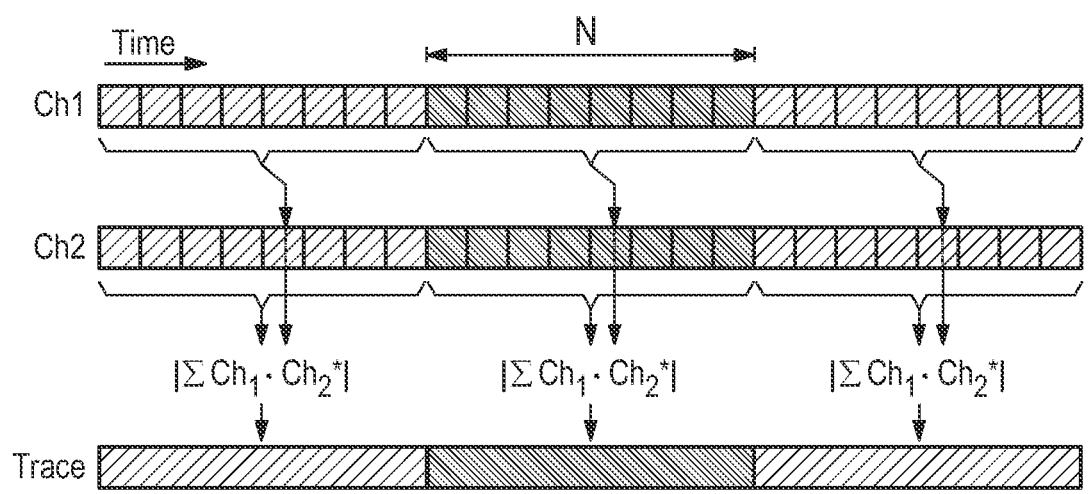
FIG. 3 shows a table illustrating mathematical operations performed by an example of a detector circuit of the measurement instrument of FIG. 1.
FIG. 4 shows a diagram illustrating an example of a combined average performed by the measurement instrument of FIG. 1.

The mathematical operations applied to the measurement signal(s) in the different detector modes are illustrated in FIG. 3, which shows a table of the mathematical operations. Therein, $y_{det}$ denotes the measurement trace, while $x(k)$ denotes the k-th sample of the respective measurement signal(s). Further, N denotes a predetermined number of samples over which the real-valued measurement signal is averaged in the average detector mode, and in the root mean square detector mode. In the last row, N denotes a predetermined number of samples over which the complex-valued measurement signals $x_1(k)$ and $x_2^*(k)$ are averaged in the cross correlation detector mode.

In the following, the cross correlation detector mode is explained in more detail with reference to FIG. 1. In the cross correlation detector mode, the detector circuit 24 comprises an averaging sub-circuit 64 having a multiplication unit 66, an averaging unit 68, and an output unit 70.

The multiplication unit 66 includes circuitry configured to multiply the first complex-valued measurement signal $y_1(k)$ with a complex conjugate of the second complex-valued measurement signal $y_2^*(k)$, thereby obtaining a complex-valued multiplication signal $y(k)$, i.e., $y(k)=y_1(k) \cdot y_2^*(k)$. The averaging unit 68 includes circuitry configured to average the complex-valued multiplication signal over a predetermined number of samples N, thereby obtaining a complex-valued average signal.

Accordingly, if $y_1(k)$ and $y_2^*(k)$ are in the frequency domain, the complex-valued average signal may correspond to the trace of the cross-correlation matrix of the first complex-valued measurement signal and the second complex-valued measurement signal, divided by the predetermined number of samples N.

The output unit 70 includes circuitry configured to determine the absolute value (Abs) of the complex-valued average signal or the real part of the complex-valued average signal, thereby obtaining an output signal of the detector circuit 24.

This way, noise originating in the measurement channels 26, 28 cancels at least partially, while the wanted signal (including a noise contribution) of the device under test 14 are preserved.

This can be seen as follows. The complex-valued measurement signals output by the digital backend 22 can be split into a correlated part from the device under test 14 ($\alpha$) and two uncorrelated noise parts ($n_1$ and $n_2$) from the measurement channels 26, 28:

$$y_1 = \alpha + n_1$$
$$y_2 = \alpha + n_2$$

The output signal (Det) of the detector circuit 24 then is $$Det = \left| \frac{1}{N} \cdot \sum_{i=0}^{N-1} y_{1i} \cdot y_{2i}^* \right| = \left| \frac{1}{N} \cdot \sum_{i=0}^{N-1} |a_i|^2 + a_i \cdot mn_{2i}^* + a_i^* \cdot n_{1i} + n_{1i} \cdot n_{2i}^* \right|$$

The first term, i.e., $1/N \sum |\alpha_i|^2$, corresponds to the average power of the input signal received from the device under test 14 over time, which corresponds to the desired detector result.

The further terms correspond to multiplications of uncorrelated signals, and thus cancel at least partially. For example, the further terms correspond to noise originating in the measurement channels 26, 28.

In some embodiments, it has been recognized that these unwanted noise contributions are reduced approximately by $5 \cdot \log_{10}(N)$ dB or by $1/\sqrt{N}$, respectively.

The result for the output signal Det given above corresponds to the absolute value of the complex-valued average signal.

Alternatively, the output signal Det may be given by $$Det = \mathrm{Re}\left\{ \frac{1}{N} \cdot \sum_{i=0}^{N-1} y_{1i} \cdot y_{2i}^* \right\} = \mathrm{Re}\left\{ \frac{1}{N} \cdot \sum_{i=0}^{N-1} |a_i|^2 + a_i \cdot mn_{2i}^* + a_i^* \cdot n_{1i} + n_{1i} \cdot n_{2i}^* \right\}$$

As can be seen from a comparison of the two possible results for the output signal Det, the two results are the same for $N \to \infty$.

In some embodiments, the predetermined number of samples N may be adjustable, e.g. via the user interface 52. In general, increasing the predetermined number of samples N leads to an enhanced noise suppression, as the non-correlated portions of the noise, i.e., the unwanted noise portions, are suppressed more the larger the number of the predetermined samples N is.

As is illustrated in FIG. 4, increasing the predetermined number of samples N leads to a smoothening of the output signal, i.e., of the measurement trace, as N samples of the complex-valued measurement signals (illustrated as "Ch1" and "Ch2" in FIG. 4) are mapped onto a single output signal sample (illustrated as "Trace" in FIG. 4).

As the predetermined number of samples N is adjustable, the detector circuit 24 can be adapted for different requirements, ranging from high resolution to high noise suppression.

In some embodiments, the output signal(s) provided by the averaging sub-circuit 64 is (are) displayed on the display 60 of the measurement instrument 12.

Figure 5:
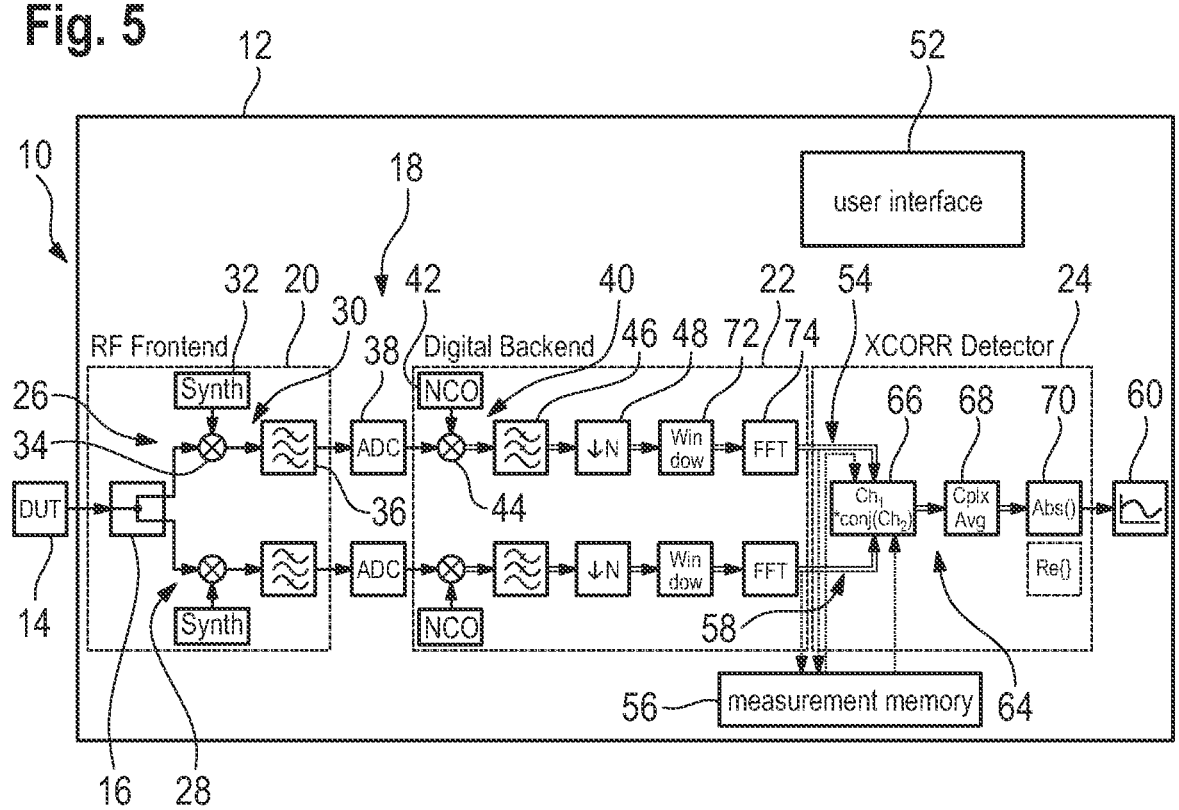
FIG. 5 shows schematically shows another embodiment of the measurement instrument of FIG. 1.

FIG. 5 shows another embodiment of the measurement system 10, wherein only the differences compared to the embodiments described above with respect to FIG. 1 are explained in the following.

Compared to the embodiment of FIG. 1, the RBW filter 50 is replaced with a window unit 72 and a Fourier transform unit 74. The window unit 72 includes circuitry configured to apply a window function to the signal output by the down-converter unit 48, thereby determining the resolution bandwidth of the measurement channels 26, 28. The Fourier transform unit 74 includes circuitry configured to determine a fast Fourier transform (FFT) of the signal output by the window unit 72. Accordingly, in this embodiment of the measurement system 10, the complex-valued measurement signals are established as a Fourier transformed signal, respectively.

In other words, the Fourier transform unit 74 determine a series of Fourier transforms of the respective signal processed over a predetermined time interval. In some embodiments, the time intervals associated with consecutive Fourier transforms may overlap.

It is noted that, alternatively or additionally to the embodiment shown in FIG. 5, the measurement memory 56 may be connected to the down-converter units 48 downstream of the down-converter units 48. Further, the measurement memory 56 may be connected to the window units 72 upstream of the window units 72. Accordingly, the signals output by the down-converter units 48 may be saved in the measurement memory 56, and may be processed by the window units 72, Fourier transform units 72 and detector circuit 24 later. In other words, the Fourier transforms may be determined and subsequently be processed by the detector circuit 24 offline.

However, it is to be understood that the Fourier transforms may be determined and subsequently be processed by the detector circuit 24 in real-time, such that a real-time analysis of the input signal received from the device under test 14 is provided.

In some embodiments, the multiplication unit 66 multiplies the first complex-valued measurement signal $FFT_1(k)$ with a complex conjugate of the second complex-valued measurement signal $FFT_2^*(k)$, thereby obtaining a complex-valued multiplication signal $FFT(k)$, i.e.

$$FFT(k) = FFT_1(k) \cdot FFT_2^*(k).$$

Figure 6:
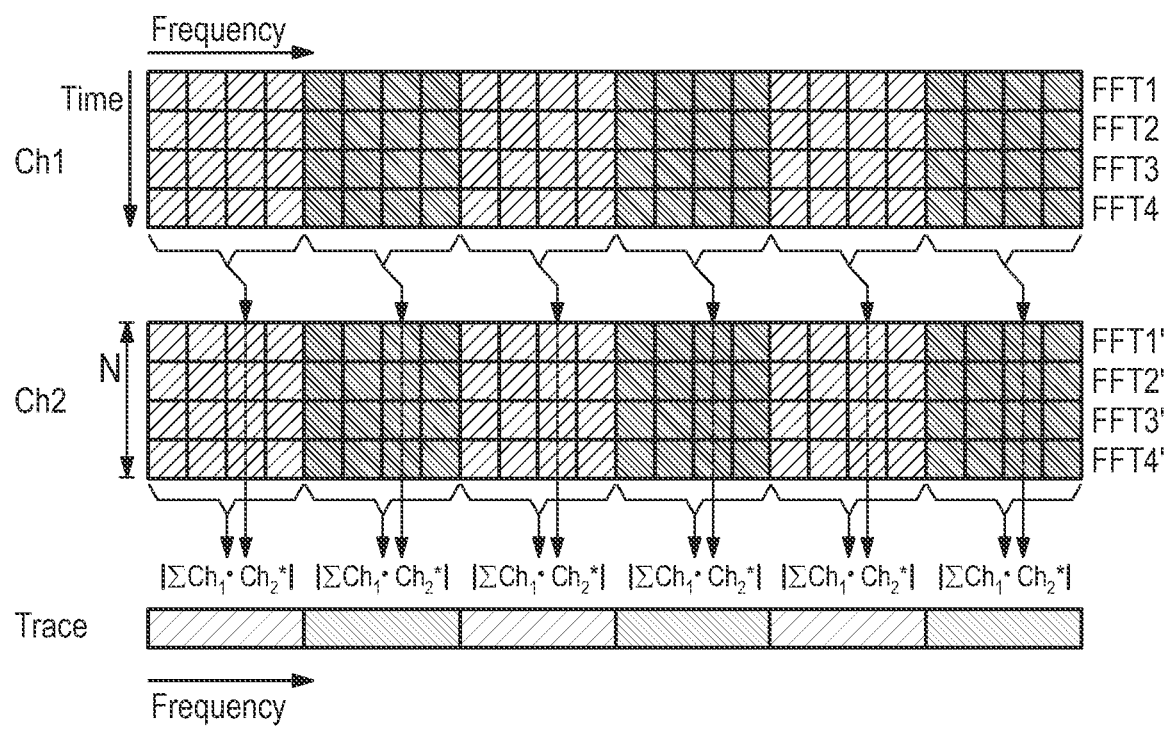
FIG. 6 shows a diagram illustrating an example of a combined average performed by the measurement instrument of FIG. 5.

As is illustrated in FIG. 6, the Fourier transformed signals (FFT1, FFT2, etc.), i.e., the complex-valued measurement signals, comprise both time and frequency information. Accordingly, the averaging sub-circuit 64 may average a predetermined number of samples N of the Fourier transformed signals in time domain. Alternatively or additionally, the averaging sub-circuit 64 may average the Fourier transformed signals over a predetermined number of samples in frequency domain. In other words, the averaging sub-circuit 64 may perform the combined average over subsequent samples of the Fourier transformed signals, and/or over adjacent bins of the Fourier transformed signals.

Certain embodiments disclosed herein include components that utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

In some examples, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically-configured circuits, machines, apparatus, devices, etc., capable of implemented the functionality described herein.

For example, various embodiments of the present disclosure or the functionality thereof may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably). Such non-transitory computer-readable storage media include all computer-readable media (including volatile and non-volatile media).

Embodiments of the present disclosure may also take the form of an apparatus, system, computing device, computing entity, and/or the like executing instructions stored on computer-readable storage media to perform certain steps or operations. The computer-readable media include cooperating or interconnected computer-readable media, which exist exclusively on a processing or processor system or distributed among multiple interconnected processing or processor systems that may be local to, or remote from, the processing or processor system. However, embodiments of the present disclosure may also take the form of an entirely hardware embodiment performing certain steps or operations.

Various embodiments are described above with reference to block diagrams and/or flowchart illustrations of apparatuses, methods, systems, and/or computer program instructions or program products. It should be understood that each block of any of the block diagrams and/or flowchart illustrations, respectively, or portions thereof, may be implemented in part by computer program instructions, e.g., as logical steps or operations executing on one or more computing devices. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein.

These computer program instructions may also be stored in one or more computer-readable memory or portions thereof, such as the computer-readable storage media described above, that can direct one or more computers or computing devices or other programmable data processing apparatus(es) to function in a particular manner, such that the instructions stored in the computer-readable memory produce an article of manufacture including computer-readable instructions for implementing the functionality specified in the flowchart block or blocks.

The computer program instructions may also be loaded onto one or more computers or computing devices or other programmable data processing apparatus(es) to cause a series of operational steps to be performed on the one or more computers or computing devices or other programmable data processing apparatus(es) to produce a computer-implemented process such that the instructions that execute on the one or more computers or computing devices or other programmable data processing apparatus(es) provide operations for implementing the functions specified in the flowchart block or blocks and/or carry out the methods described herein.

It will be appreciated that the term computer or computing device can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

Accordingly, blocks of the block diagrams and/or flowchart illustrations support various combinations for performing the specified functions, combinations of operations for performing the specified functions and program instructions for performing the specified functions. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A detector circuit for a measurement instrument, comprising:
    a first signal input configured to receive a first complex-valued measurement signal associated with an input signal received from a device under test;
    a second signal input configured to receive a second complex-valued measurement signal associated with the input signal received from the device under test; and
    an averaging sub-circuit configured to determine a combined average of the first complex-valued measurement signal and of a complex conjugate of the second complex-valued measurement signal over a predetermined number of samples, thereby obtaining a complex-valued average signal;
    wherein the averaging sub-circuit is configured to generate an output signal based on the complex-valued average signal, and
    wherein the detector circuit is switchable between different detector modes, and wherein the detector modes comprise a cross correlation detector mode and one or several of the following detector modes: a sample detector mode, a minimum detector mode, a maximum detector mode, an auto peak detector mode, an average detector mode, and a root mean square detector mode.

2. The detector circuit of claim 1, wherein the averaging sub-circuit is configured to determine an absolute value of the complex-valued average signal in order to generate the output signal, and/or wherein the averaging sub-circuit is configured to determine a real part of the complex-valued average signal in order to generate the output signal.

3. The detector circuit of claim 1, wherein the first complex-valued measurement signal and the second complex-valued measurement signal are established as an IQ signal, respectively, and/or wherein the first complex-valued measurement signal and the second complex-valued measurement signal are established as a Fourier transformed signal, respectively.

4. The detector circuit according to claim 1, wherein the predetermined number of samples is adjustable.

5. A measurement instrument comprising a detector circuit according to claim 1.

6. The measurement instrument of claim 5, further comprising a display configured to display the output signal of the detector circuit.

7. A signal processing circuit for a measurement instrument, comprising:
    a detector circuit comprising
        a first signal input configured to receive a first complex-valued measurement signal associated with an input signal received from a device under test;
        a second signal input configured to receive a second complex-valued measurement signal associated with the input signal received from the device under test; and
        an averaging sub-circuit configured to determine a combined average of the first complex-valued measurement signal and of a complex conjugate of the second complex-valued measurement signal over a predetermined number of samples, thereby obtaining a complex-valued average signal, wherein the averaging sub-circuit is configured to generate an output signal based on the complex-valued average signal;
    a measurement input; and
    two parallel measurement channels, wherein the two parallel measurement channels are each connected to the measurement input, such that an input signal received via the measurement input is forwarded to the two parallel measurement channels,
    wherein a first one of the two parallel measurement channels is connected with the first signal input of the detector circuit and a second one of the two parallel measurement channels is connected with the second signal input of the detector circuit,
    wherein the first one of the two parallel measurement channels is configured to process the input signal, thereby generating the first complex-valued measurement signal, and wherein the second one of the two parallel measurement channels is configured to process the input signal, thereby generating the second complex-valued measurement signal.

8. The signal processing circuit of claim 7, wherein the two parallel measurement channels are functionally identical.

9. The signal processing circuit of claim 7, wherein the two parallel measurement channels each comprise an analog-to-digital converter.

10. The signal processing circuit according to claim 7, wherein the two parallel measurement channels are synchronized.

11. The signal processing circuit according to claim 7, wherein the two parallel measurement channels each comprise a mixer sub-circuit, wherein the mixer sub-circuits are configured to convert the input signal into an IQ signal, respectively.

12. The signal processing circuit according to claim 7, wherein the two parallel measurement channels each comprise a resolution bandwidth filter.

13. The signal processing circuit according to claim 7, wherein the two parallel measurement channels each comprise a Fourier transform unit, wherein the Fourier transform units each include circuitry configured to determine a Fourier transform of the respective signal processed in the respective measurement channel over a predetermined time interval.

14. The signal processing circuit of claim 13, wherein the predetermined time interval is adjustable.

15. The signal processing circuit according to claim 7, wherein the first signal input and the second signal input are selectively connectable to a measurement memory, and/or to the parallel measurement channels.

16. A measurement instrument comprising a signal processing circuit according to claim 5.

17. The measurement instrument of claim 16, further comprising a display configured to display the output signal of the detector circuit.

* * * * *

UNITED STATES PATENT AND TRADEMARK OFFICE
CERTIFICATE OF CORRECTION

PATENT NO. : 12,352,792 B2  
APPLICATION NO. : 18/169732  
DATED : July 8, 2025  
INVENTOR(S) : Wolfgang Wendler et al.

Page 1 of 1

It is certified that error appears in the above-identified patent and that said Letters Patent is hereby corrected as shown below:

In the Claims

| Column | Line | |
|---|---|---|
| 18 | 16 | Claim 16, delete "claim 5." and insert -- claim 7. -- |

Signed and Sealed this  
Twentieth Day of January, 2026

John A. Squires  
*Director of the United States Patent and Trademark Office*